US006873535B1

United States Patent
Lin et al.

(10) Patent No.: US 6,873,535 B1
(45) Date of Patent: Mar. 29, 2005

(54) MULTIPLE WIDTH AND/OR THICKNESS WRITE LINE IN MRAM

(75) Inventors: Wen Chin Lin, Hsin-Chu (TW); Denny Tang, Saratoga, CA (US); Li-Shyue Lai, Jhube (TW); Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/771,691

(22) Filed: Feb. 4, 2004

(51) Int. Cl.$^7$ .................................................. G11C 5/08
(52) U.S. Cl. ..................... 365/66; 365/158; 365/171; 365/51; 365/63; 438/3
(58) Field of Search ......................... 365/158, 173, 365/171, 51, 66, 63; 438/3

(56) References Cited

U.S. PATENT DOCUMENTS

| | | | |
|---|---|---|---|
| 5,956,267 A | 9/1999 | Hurst et al. ................. 365/158 |
| 6,097,625 A | 8/2000 | Scheuerlein ................. 365/171 |
| 6,256,224 B1 * | 7/2001 | Perner et al. ................ 365/173 |
| 6,272,041 B1 | 8/2001 | Naji ............................ 365/171 |
| 6,331,943 B1 | 12/2001 | Naji et al. ................... 365/158 |
| 6,363,000 B2 * | 3/2002 | Perner et al. ................. 365/66 |
| 6,556,473 B2 | 4/2003 | Saito et al. .................. 365/158 |
| 6,584,006 B2 * | 6/2003 | Viehmann ..................... 365/97 |

* cited by examiner

*Primary Examiner*—Andrew Q. Tran
(74) *Attorney, Agent, or Firm*—Haynes and Boone, LLP (57) ABSTRACT

A magnetic random access memory (MRAM) cell including an MRAM cell stack located over a substrate and first and second write lines spanning opposing termini of the MRAM cell stack. At least one of the first and second write lines includes at least one first portion spanning the MRAM cell stack and at least one second portion proximate the MRAM cell stack. The first and second portions have first and second cross-sectional areas, respectively, wherein the first cross-sectional area is substantially less than the second cross-sectional area.

39 Claims, 5 Drawing Sheets

MULTIPLE WIDTH AND/OR THICKNESS WRITE LINE IN MRAM

CROSS-REFERENCE

This application is related to the following commonly-assigned U.S. Patent Applications, the entire disclosures of which are hereby incorporated herein by reference:

"MULTI-SENSING LEVEL MRAM STRUCTURES," Ser. No. 10/685,824, filed Oct. 13, 2003, having Wen Chin Lin and Denny D. Tang named as inventors.

"MULTI-SENSING LEVEL MRAM STRUCTURE WITH DIFFERENT MAGNETO-RESISTANCE RATIOS," Ser. No. 10/678,699, filed Oct. 3, 2003, having Wen Chin Lin and Denny D. Tang named as inventors.

This application is also related to the following commonly-assigned U.S. Patent Applications:

"NON-ORTHOGONAL WRITE LINE STRUCTURE IN MRAM," Ser. No. 10/827,079, having Wen Chin Lin, Denny D. Tang and Li-Shyue Lai named as inventors.

"SEGMENTED MRAM MEMORY ARRAY," Ser. No. 10/780,171, having Wen Chin Lin, Denny D. Tang and Li-Shyue Lai named as inventors.

BACKGROUND

The present disclosure relates generally to magnetic random access memory (MRAM) devices and, more specifically, to an MRAM cell having a write line of multiple thicknesses and/or widths.

Magnetic random access memory (MRAM) cells are often based on a magnetic tunnel junction (MTJ) cell comprising at least three basic layers: a "free" ferromagnetic layer, an insulating tunneling barrier, and a "pinned" ferromagnetic layer. In the free layer, magnetization moments are free to rotate under an external magnetic field, but the magnetic moments in the "pinned" layer are not. In order to sense states in the MTJ configuration, a constant current can be applied through the cell. As the magneto-resistance varies according to the state stored in the cell, the voltage can be sensed over the memory cell. To write or change the state in the memory cell, an external magnetic field can be applied that is sufficient to completely switch the direction of the magnetic moments of the free magnetic layers. In general, bit lines, word lines, control lines, program lines, and other write lines (herein collectively referred to as write lines) are employed to create the magnetic field during cell operation.

Write lines generally have substantially constant widths and thicknesses which are optimized according to desired performance characteristics. For example, an insufficient cross-sectional area of the write lines (the product of width and thickness) results in excessively high line resistance. However, an excessive cross-sectional area of the write lines can degrade magnetic flux efficiency, possibly due to low current density. Hence, in selecting a write line cross-sectional area, MRAM cell designers are faced with the dichotomy of high line resistance and degraded magnetic flux density.

Accordingly, what is needed is an MRAM device and method of manufacture thereof that addresses the issues discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
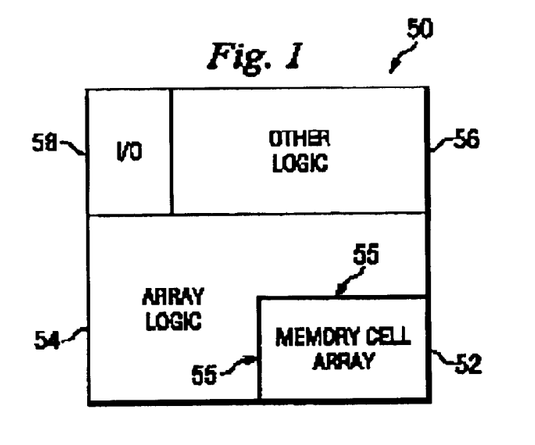
FIG. 1 illustrates a block diagram of one embodiment of an integrated circuit device having a memory cell array according to aspects of the present disclosure.

Referring to FIG. 1, illustrated is a block diagram of one embodiment of an integrated circuit 50 that is one example of a circuit that can benefit from aspects of the present disclosure. The integrated circuit 50 includes a memory cell array 52 that can be controlled by an array logic 54 through an interface 55. It is well known in the art that various logic circuitry, such as row and column decoders and sense amplifiers, can be included in the array logic 54, and that the interface 55 may include one or more bit lines, gate lines, digit lines, control lines, word lines, and other communication paths to interconnect the memory cell array 52 with the array logic 54. These communication paths will hereinafter be referred to as bit lines or word lines, it being understood that different applications of the present disclosure may use different communication paths. The integrated circuit can further include other logic 56 such as counters, clock circuits, and processing circuits, and input/output circuitry 58 such as buffers and drivers.

Figure 2:
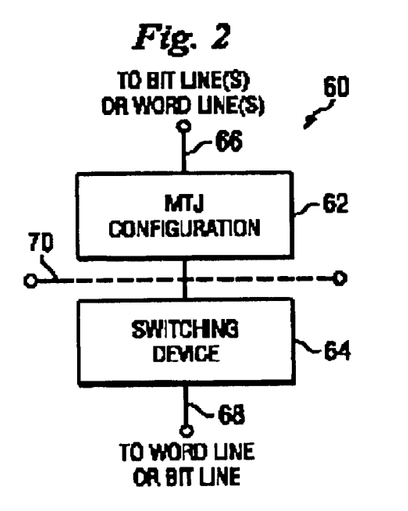
FIG. 2 illustrates a block diagram of one embodiment of a memory cell for use in the memory cell array shown in FIG. 1 according to aspects of the present disclosure.

Referring to FIG. 2, the memory cell array 52 of FIG. 1 may include one or more magnetic random access memory (MRAM) cells 60. Each MRAM cell 60 does not need to be commonly configured, but for the sake of example, can be generically described as including a configuration of MTJ devices 62 and a switching device 64. Examples of various embodiments of the MTJ devices 62 are discussed in further detail below, and examples of the switching device 64 include a metal oxide semiconductor (MOS) transistor, an MOS diode, and/or a bipolar transistor. The memory cell 60 can store 1, 2, 3, 4 or more bits, but for the sake of further example, a two bit configuration will be discussed. Also, the present disclosure is applicable and/or readily adaptable to single and double junction MTJ devices with different MR ratios, where there can be four magneto-resistance levels. The different MR ratios may facilitate the capability of sensing at least four levels of magneto-resistance, and the capacity to store at least two bits.

The MRAM cell 60 may include three terminals, a first terminal 66, a second terminal 68, and a third terminal 70. For the sake of example, the first terminal 66 is connected to one or more bit lines and produces an output voltage in a read operation, which is provided to the bit line(s). The second terminal 68 is connected to one or more word lines, which can activate the cell 60 for a read or write operation. The third terminal 70 may be proximate a control line, such as a gate or digit line, and can provide a current for producing a magnetic field to effect the MTJ configuration 62. It is understood that the arrangement of bit lines, word lines, control lines, and other communication signals can vary for different circuit designs, and the present discussion is only providing one example of such an arrangement.

Figure 3:
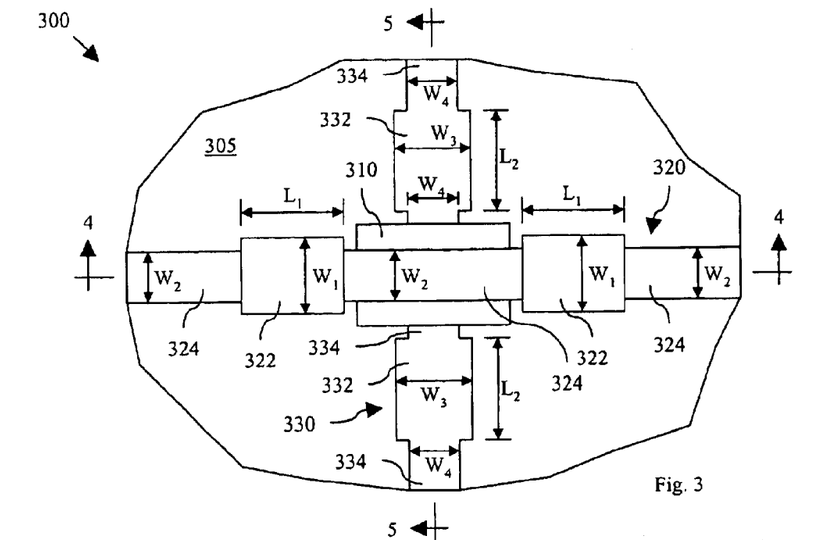
FIG. 3 illustrates a plan view of one embodiment of a portion of a magnetic random access memory (MRAM) cell constructed according to aspects of the present disclosure.

Referring to FIG. 3, illustrated is a plan view of one embodiment of an MRAM cell 300 constructed according to aspects of the present disclosure. The MRAM cell 300 includes an MRAM cell stack 310 and write lines 320 and 330. The MRAM stack 310 may include a pinned layer located over a substrate 305, a tunneling barrier layer located over the pinned layer, and a free layer located over the tunneling barrier layer. The MRAM stack 310 may interpose the write line 320 and the substrate 305, and the write line 330 may interpose the MRAM stack 310 and the substrate 305, such that the write lines 320, 330 span opposing sides and/or terminals of the MRAM stack 310. However, in other embodiments, the write lines 320, 330 may be located on the same side of the MRAM stack 310. For example, the MRAM stack 310 may interpose the substrate 305 and both of the write lines 320, 330.

The write line 320 includes larger portions 322 and smaller portions 324. One of the smaller write line portions 324 extends over the MRAM cell stack 310, such that two larger write line portions 322 may be oriented proximate or adjacent opposing sides of the MRAM cell stack 310. The larger write line portions 322 may have a width $W_1$, and the smaller write line portions 324 may have a width $W_2$, wherein the widths $W_1$ and $W_2$ are substantially perpendicular to the longitudinal axis of the write line 320. The width $W_1$ may range between about 2300 Angstroms and about 3500 Angstroms, and the width $W_2$ may range between about 2000 Angstroms and about 3000 Angstroms. In one embodiment, the width $W_1$ is about 2600 Angstroms and the width $W_2$ is about 2300 Angstroms. The larger write line portions 324 may also have a length $L_1$ ranging between about 1000 Angstroms and about 10,000 Angstroms. For example, in one embodiment, the length $L_1$ is about 2300 Angstroms. The remainder of the write line 320 may have the width $W_2$ of the smaller portions 324. However, in another embodiment, the smaller write line portions 324 may only be proximate the MRAM cell stack 310 (and/or other MRAM cell stacks), such that the remainder of the write line 320 may have the width $W_1$ of the larger portions 322.

The write line 330 includes larger portions 332 and smaller portions 334. One of the smaller write line portions 334 extends under the MRAM cell stack 310, such that two larger write line portions 332 may be oriented proximate or adjacent opposing sides of the MRAM cell stack 310. The larger write line portions 332 may have a width $W_3$, and the smaller write line portions 334 may have a width $W_4$, wherein the widths $W_3$ and $W_4$ are substantially perpendicular to the longitudinal axis of the write line 330. The width $W_3$ may range between about 2300 Angstroms and about 10,000 Angstroms, and the width $W_4$ may range between about 2000 Angstroms and about 10,000 Angstroms. In one embodiment, the width $W_3$ is about 2600 Angstroms and the width $W_4$ is about 2300 Angstroms. The larger write line portions 334 may also have a length $L_2$ ranging between about 1000 Angstroms and about 10,000 Angstroms. For example, in one embodiment, the length $L_2$ is about 2300 Angstroms. The remainder of the write line 330 may have the width $W_4$ of the smaller portions 334. However, in another embodiment, the smaller write line portions 334 may only be proximate the MRAM cell stack 310 (and/or other MRAM cell stacks), such that the remainder of the write line 330 may have the width $W_3$ of the larger portions 332.

Figure 4:
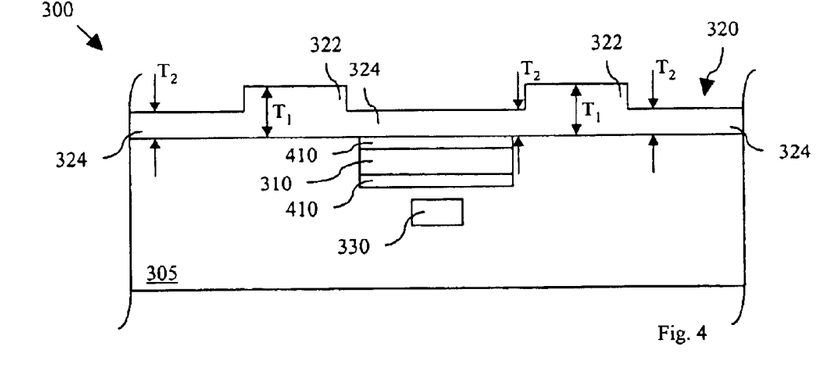
FIG. 4 illustrates a sectional view of the MRAM cell shown in FIG. 3.

Referring to FIG. 4, illustrated is a sectional view of the MRAM cell 300 shown in FIG. 3. A shown in FIG. 4, the larger write line portions 322 may have a thickness $T_1$, and the smaller write line portions 324 may have a thickness $T_2$, wherein the thicknesses $T_1$ and $T_2$ may be relative to a height extending away from the substrate 305. The thickness $T_1$ may range between about 500 Angstroms and about 5000 Angstroms, and the thickness $T_2$ may range between about 500 Angstroms and about 5000 Angstroms. In one embodiment, the thickness $T_1$ is about 4000 Angstroms and the thickness $T_2$ is about 2000 Angstroms.

FIG. 4 also illustrates that the MRAM cell stack 310 may be connected to one or more interconnects 410. The interconnects 410 may connect the MRAM cell stack 310 to other MRAM cells, transistor devices and/or other microelectronic devices. The write lines 320, 330 may be in direct contact with the MRAM cell stack 310 via an interposing one or more interconnects 410, or may be separated from the MRAM cell stack 310 and/or proximate interconnects 410 by a dielectric layer or other portion of the substrate 305. Although not illustrated as such, at least one of the write lines 320, 330 may also be in direct physical contact with the MRAM cell stack 310.

Figure 5:
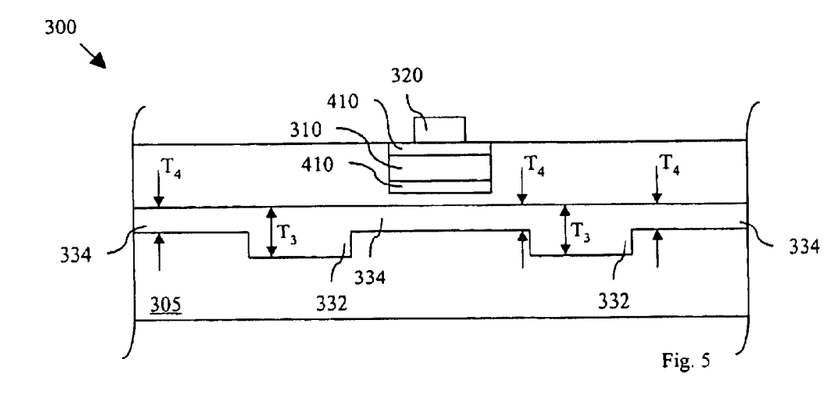
FIG. 5 illustrates another sectional view of the MRAM cell shown in FIG. 3.

Referring to FIG. 5, illustrated is a sectional view of the MRAM cell 300 shown in FIG. 3. As shown in FIG. 5, the larger write line portions 332 may have a thickness $T_3$, and the smaller write line portions 334 may have a thickness $T_4$, wherein the thicknesses $T_3$ and $T_4$ may be relative to a direction extending away from the substrate 305. The thickness $T_3$ may range between about 500 Angstroms and about 5000 Angstroms, and the thickness $T_4$ may range between about 500 Angstroms and about 5000 Angstroms. In one embodiment, the thickness $T_3$ is about 4000 Angstroms and the thickness $T_4$ is about 2000 Angstroms.

It follows from the discussion above that the smaller write line portions 324 may have a cross-sectional area that is substantially less (e.g., about 20% less) than the cross-sectional area of the larger write line portions 322, and that the smaller write line portions 334 may have a cross-sectional area that is substantially less (e.g., about 20% less) than the larger write line portions 332. For example, as discussed above, the width $W_2$ of the smaller write line portions 324 may be smaller than the width $W_1$ of the larger write line portions 322. A similar relationship may exist between the widths $W_3$ and $W_4$. In another embodiment, the thickness $T_2$ of the smaller write line portions 324 may be smaller than the thickness $T_1$ of the larger write line portions 322. A similar relationship may exist between the thicknesses $T_3$ and $T_4$. In one embodiment, the width and thickness of the smaller write line portions 324 may be less than the width and thickness of the larger write line portions 322. A similar relationship may exist between the widths and thicknesses of the write line portions 334 and 332.

The write lines 320, 330 may be electrically conductive bit- or word-lines in a memory cell array or other integrated circuit. In one embodiment, one or both of the write lines 320, 330 include a bulk conductor and another one or more layers. The bulk conductor may be formed by CVD, PECVD, ALD, PVD, electrochemical deposition, molecular manipulation and/or other processes, and may comprise Cu, Al, Ag, Au, W, alloys/compounds thereof and/or other materials. The write lines 320, 330 may also include a barrier layer comprising Ti, Ta, TiN, TaN, WN, SiC and/or other materials.

Figure 6:
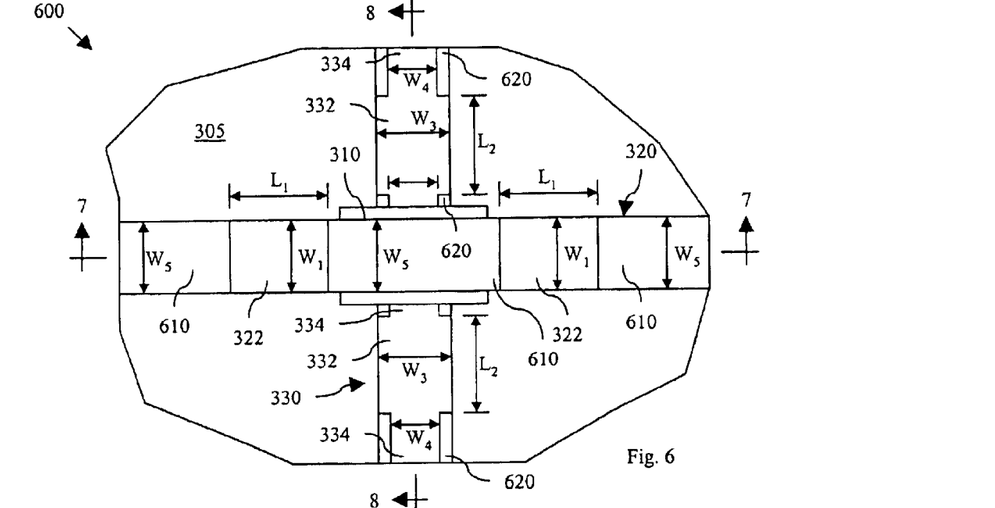
FIG. 6 illustrates a plan view of another embodiment of a portion of an MRAM cell constructed according to aspects of the present disclosure.

Referring to FIG. 6, illustrated is a plan view of another embodiment of the MRAM cell 300 shown in FIG. 3, herein designated by the reference numeral 600. The MRAM cell 600 includes cladding layers 610, 620 located over at least portions of the write lines 320, 330, respectively. The cladding layers 610, 620 may surround a substantial portion of the perimeters of the smaller write line portions 324, 334, respectively. For example, the smaller write line portions 324, 334 may each have a four-sided perimeter and the cladding layers 610, 620 may surround or cover three of the four sides of the associated smaller write line portions 324, 334. In other embodiments, the cladding layers 610, 620 may substantially encompass the perimeter of the bulk conductor. The cladding layers 610, 620 may comprise NiFe, NiFeCo, CoFe, Fe, Co, Ni, alloys/compounds thereof and/or other ferromagnetic materials, and may be formed by CVD, PECVD, ALD, PVD, electrochemical deposition, molecular manipulation and/or other processes. The thickness of the cladding layers 610, 620 may range between about 100 Angstroms and about 2000 Angstroms.

The cladding layers 610 may have widths $W_5$ that are substantially similar to the widths $W_1$ of the larger write line portions 322. Thus, in one embodiment, at least a portion of the perimeter of the cladding layers 610, and/or at least portions of an aggregate perimeter of the cladding layers 610 and the smaller write line portions 324, may coincide or be substantially similar to the perimeter of the larger write line portions 322. A similar relationship may exist between the perimeters of the larger write line portions 332, the smaller write line portions 334, and the cladding layers 620, or portions thereof.

Figure 7:
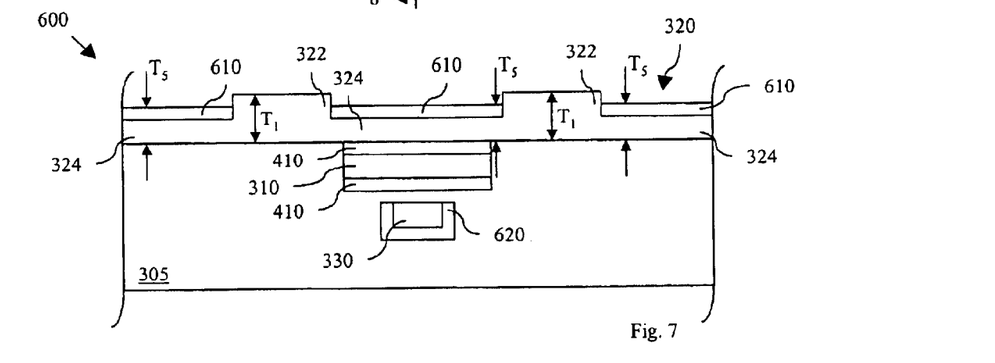
FIG. 7 illustrates a sectional view of the MRAM cell shown in FIG. 6.

Referring to FIG. 7, illustrated is a sectional view of the MRAM cell 600 shown in FIG. 6. The cladding layers 610 and smaller write line portions 324 may collectively have a thickness $T_5$ that is equal to or less than the thickness $T_1$ of the larger write line portions 322. As also shown in FIG. 7, the cladding layers 620 may substantially surround the perimeter of the smaller write line portions 330 with the possible exception of the portion or portions of the perimeter nearest the MRAM cell stack 310.

Figure 8:
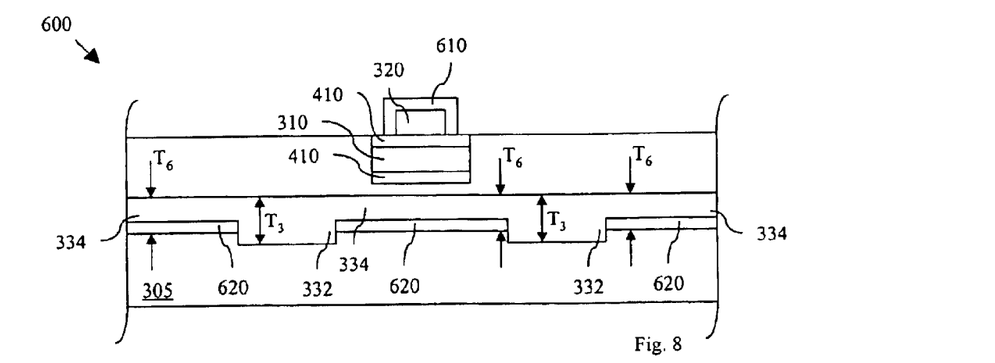
FIG. 8 illustrates another sectional view of the MRAM cell shown in FIG. 6.

Referring to FIG. 8, illustrated is another sectional view of the MRAM cell 600 shown in FIG. 6. The cladding layers 620 and smaller write line portions 334 may collectively have a thickness $T_6$ that is equal to or less than the thickness $T_3$ of the larger write line portions 332. As also shown in FIG. 8, the cladding layers 610 may substantially surround the perimeter of the smaller write line portions 320 with the possible exception of for the portion or portions of the perimeter nearest the MRAM cell stack 310.

Figure 9:
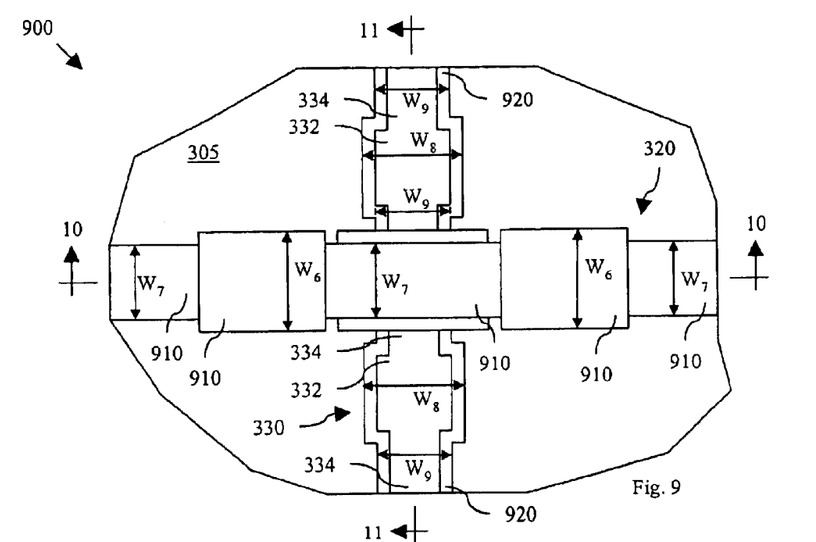
FIG. 9 illustrates a plan view of another embodiment of a portion of an MRAM cell constructed according to aspects of the present disclosure.

Referring to FIG. 9, illustrated is a plan view of another embodiment of the MRAM cell 300 shown in FIG. 3, herein designated by the reference numeral 900. The MRAM cell 900 includes cladding layers 910, 920 located over all or portions of the write lines 320, 330, respectively. The cladding layers 910, 920 may be substantially similar in composition and manufacture to the cladding layers 610, 620 described above in relation to FIGS. 6–8. The cladding layers 910, 920 may surround all or a substantial portion of the perimeters of the write lines 320, 330, respectively. For example, the write lines 320, 330 may each have a four-sided perimeter and the cladding layers 910, 920 may surround or cover three of the four sides of the associated smaller write lines 320, 330. In other embodiments, the cladding layers 910, 920 may substantially encompass the perimeter of the bulk conductor. The cladding layers 910, 920 may comprise NiFe, NiFeCo, CoFe, Fe, Co, Ni, alloys/compounds thereof and/or other ferromagnetic materials, and may be formed by CVD, PECVD, ALD, PVD, electrochemical deposition, molecular manipulation and/or other processes.

The cladding layers 910, 920 may be formed to substantially follow the contour or profile of the write lines 320, 330. For example, the cladding layer 910 may have multiple widths $W_6$ and $W_7$ that conform to the contour or profile of the widths $W_1$ and $W_2$ of the write line 320, and the cladding layer 920 may have multiple widths $W_8$ and $W_9$ that conform to the contour or profile of the widths $W_3$ and $W_4$ of the write line 330 (as shown in FIGS. 3 and 9). The difference between the corresponding widths $W_1$ and $W_6$, corresponding widths $W_2$ and $W_7$, corresponding widths $W_3$ and $W_8$, and corresponding widths $W_4$ and $W_9$, may be about twice the thickness of the cladding layers 910, 920.

Figure 10:
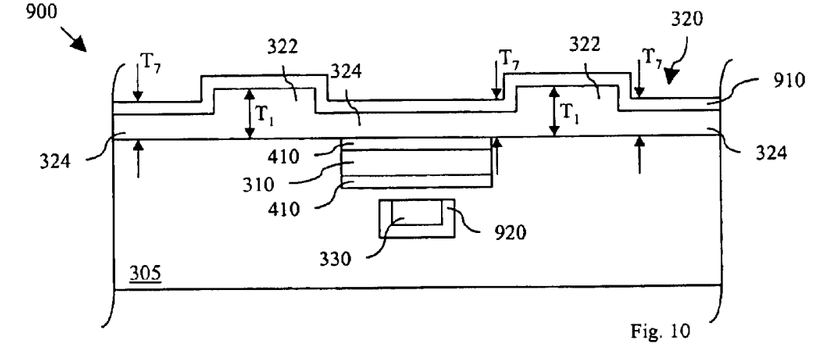
FIG. 10 illustrates a sectional view of the MRAM cell shown in FIG. 9.

Referring to FIG. 10, illustrated is a sectional view of the MRAM cell 900 shown in FIG. 9. The cladding layers 910 and smaller write line portions 324 may collectively have a thickness $T_7$ that is equal to or less than the thickness $T_1$ of the larger write line portions 322. As also shown in FIG. 10, the cladding layers 920 may substantially surround the perimeter of the smaller write line portions 330 with the possible exception of the portion or portions of the perimeter nearest the MRAM cell stack 310.

Figure 11:
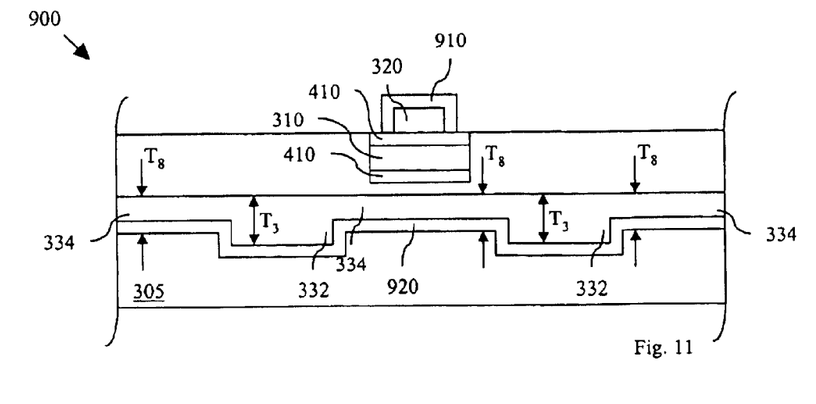
FIG. 11 illustrates another sectional view of the MRAM cell shown in FIG. 9.

Referring to FIG. 11, illustrated is another sectional view of the MRAM cell 900 shown in FIG. 9. The cladding layers 920 and smaller write line portions 334 may collectively have a thickness $T_8$ that is equal to or less than the thickness $T_3$ of the larger write line portions 332. As also shown in FIG. 11, the cladding layers 910 may substantially surround the perimeter of the smaller write line portions 320 with the possible exception of for the portion or portions of the perimeter nearest the MRAM cell stack 310.

Figure 12:
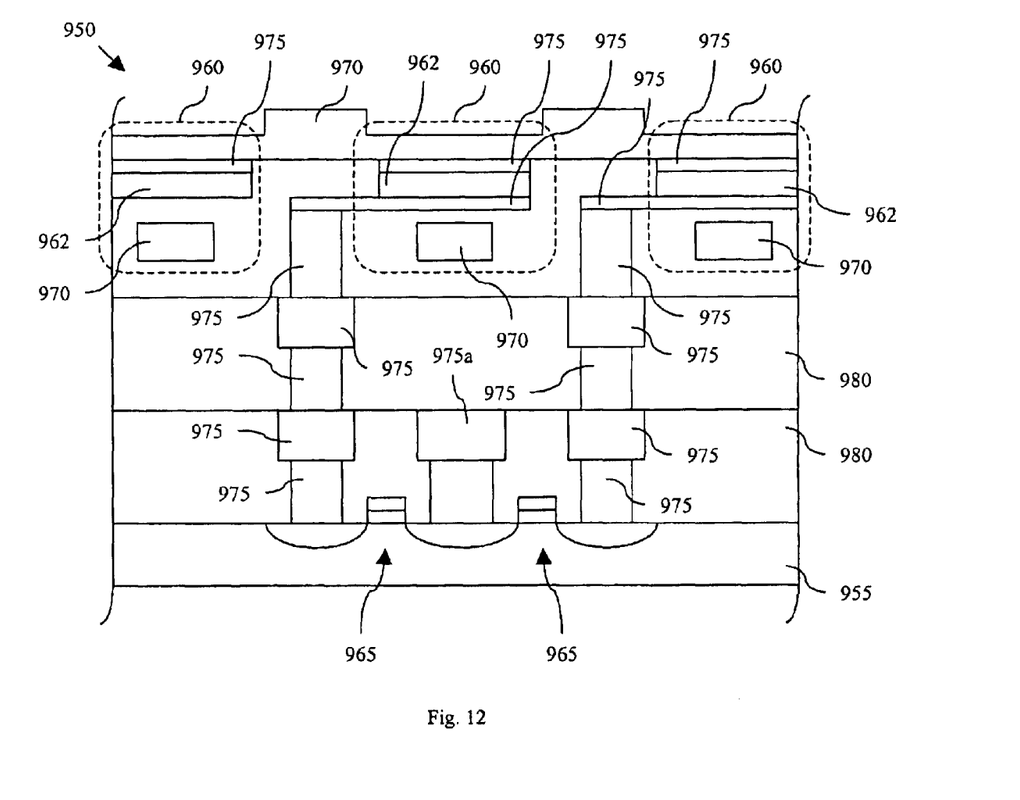
FIG. 12 illustrates a sectional view of one embodiment of an integrated circuit device constructed according to aspects of the present disclosure.

Referring to FIG. 12, illustrated is a plan view of one embodiment of an integrated circuit device 950 constructed according to aspects of the present disclosure. The integrated circuit device 950 is one environment in which the MRAM cells 300, 600, 900 discussed above may be implemented. For example, the integrated circuit device 950 includes a plurality of memory cells 960, ones of which may be substantially similar to the MRAM cell 300 shown in FIG. 3, the MRAM cell 600 shown in FIG. 6, and/or the MRAM cell 900 shown in FIG. 9. The memory cells 960 each include an MRAM cell stack 962 and may collectively form or be integrated with a memory cell array, including a one-, two- or three-dimensional array. The memory cells 960 may also be oriented in one or more rows and/or one or more columns, such as on or over a substrate 955. The substrate 955 may be substantially planar or substantially spherical, and/or may have a spherical or otherwise rounded surface on, over or from which the plurality of MRAM cells 960 and/or a plurality of transistor devices 965 may be formed.

The integrated circuit device 950 also includes one or more write lines 970 that may interconnect ones of the plurality of memory cells 960. The integrated circuit device 950 may also include interconnects 975 extending along and/or through one or more dielectric layers 980. The interconnects 975 couple ones of the memory cells 960 and/or the transistor devices 965. The dielectric layers 980 may comprise silicon dioxide, Black Diamond® (a product of Applied Materials of Santa Clara, Calif.) and/or other materials, and may be formed by CVD, PECVD, ALD, PVD, spin-on coating and/or other processes. The dielectric layers 980 may have a thickness ranging between about 2000 Angstroms and about 15,000 Angstroms. The interconnects 975 may comprise copper, tungsten, gold, aluminum, carbon nano-tubes, carbon fullerenes, refractory metals and/or other materials, and may be formed by CVD, PECVD, ALD, PVD and/or other processes. One of the interconnects 975a may also be employed as a common ground.

Thus, the present disclosure introduces a magnetic random access memory (MRAM) cell, comprising an MRAM cell stack located over a substrate and first and second write lines spanning opposing termini of the MRAM cell stack. At least one of the first and second write lines includes at least one first portion spanning the MRAM cell stack and at least one second portion proximate the MRAM cell stack. The first and second portions have first and second cross-sectional areas, respectively, wherein the first cross-sectional area is substantially less than the second cross-sectional area.

Another embodiment of an MRAM cell constructed according to aspects of the present disclosure includes an MRAM cell stack located over a substrate, a first write line opposite the MRAM cell stack from the substrate, and a second write lines interposing the MRAM cell stack and the substrate. The first write line includes a first portion and at least two second portions. The first portion spans the MRAM cell stack and has a first cross-sectional area. The second portions are located proximate opposing sides of the MRAM cell stack and have second cross-sectional areas each substantially greater than the first cross-sectional area. The second write line includes a third portion and at least two fourth portions. The third portion spans the MRAM cell stack and has a third cross-sectional area. The fourth portions are located proximate opposing sides of the MRAM cell stack and have fourth cross-sectional areas each substantially greater than the third cross-sectional area.

The present disclosure also introduces a method of manufacturing an MRAM cell. In one embodiment, the method includes forming an MRAM cell stack located over a substrate and forming first and second write lines spanning opposing termini of the MRAM cell stack. At least one of the first and second write lines includes at least one first portion spanning the MRAM cell stack and at least one second portion proximate the MRAM cell stack. The first and second portions have first and second cross-sectional areas, respectively, wherein the first cross-sectional area is substantially less than the second cross-sectional area.

An integrated circuit device is also provided in the present disclosure. In one embodiment, the integrated circuit device includes an MRAM cell located over a substrate, a transistor device formed at least partially in the substrate, and an interconnect coupled the MRAM cell and the transistor device. The MRAM cell includes an MRAM cell stack located over the substrate and first and second write lines spanning opposing termini of the MRAM cell stack. At least one of the first and second write lines includes at least one first portion spanning the MRAM cell stack and at least one second portion proximate the MRAM cell stack. The first and second portions have first and second cross-sectional areas, respectively, wherein the first cross-sectional area is substantially less than the second cross-sectional area. The interconnect couples the transistor device and one of the first and second write lines.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A magnetic random access memory (MRAM) cell, comprising:

an MRAM cell stack located over a substrate; and first and second write lines spanning opposing termini of the MRAM cell stack;

wherein at least one of the first and second write lines includes at least one first portion spanning the MRAM cell stack and at least one second portion proximate the MRAM cell stack, the first and second portions having first and second cross-sectional areas, respectively, wherein the first cross-sectional area is substantially less than the second cross-sectional area.

2. The MRAM cell of claim 1 wherein the first write line interposes the MRAM cell stack and the substrate and the MRAM cell stack interposes the substrate and the second write line.

3. The MRAM cell of claim 1 wherein the at least one of the first and second write lines includes two second portions proximate opposing sides of the MRAM cell stack.

4. The MRAM cell of claim 1 wherein the first write line includes the first and second portions and the second write line includes at least one third portion spanning the MRAM cell stack and at least one fourth portion proximate the MRAM cell stack, the third and fourth portions having third and fourth cross-sectional areas, respectively, wherein the third cross-sectional area is substantially less than the fourth cross-sectional area.

5. The MRAM cell of claim 1 wherein the first and second portions have first and second thicknesses, respectively, wherein the first thickness is substantially less than the second thickness.

6. The MRAM cell of claim 1 wherein the first thickness ranges between about 1000 Angstroms and about 4000 Angstroms and the second thickness ranges between about 2000 Angstroms and about 6000 Angstroms.

7. The MRAM cell of claim 1 wherein the first and second portions have first and second widths, respectively, wherein the first width is substantially less than the second width.

8. The MRAM cell of claim 7 wherein the first width ranges between about 500 Angstroms and about 5000 Angstroms and the second width ranges between about 1000 Angstroms and about 10,000 Angstroms.

9. The MRAM cell of claim 1 wherein:
the first and second portions have first and second thicknesses, respectively, wherein the first thickness is substantially less than the second thickness; and
the first and second portions have first and second widths, respectively, wherein the first width is substantially less than the second width.

10. The MRAM cell of claim 1 wherein the first cross-sectional area is at least about 20% less than the second cross-sectional area.

11. The MRAM cell of claim 1 wherein the first write line is a memory array word line and the second write line is a memory array bit line.

12. The MRAM cell of claim 1 further comprising a cladding layer at least partially surrounding the first portion.

13. The MRAM cell of claim 12 wherein at least a portion of a profile of the cladding layer is substantially similar to at least a portion of a profile of the second portion.

14. The MRAM cell of claim 1 further comprising a cladding layer at least partially surrounding each of the first and second portions.

15. A magnetic random access memory (MRAM) cell, comprising:
an MRAM cell stack located over a substrate;
a first write line opposite the MRAM cell stack from the substrate and including a first portion and at least two second portions, the first portion spanning the MRAM cell stack and having a first cross-sectional area, the second portions located proximate opposing sides of the MRAM cell stack and having second cross-sectional areas each substantially greater than the first cross-sectional area; and
a second write line interposing the MRAM cell stack and the substrate and including a third portion and at least two fourth portions, the third portion spanning the MRAM cell stack and having a third cross-sectional area, the fourth portions located proximate opposing sides of the MRAM cell stack and having fourth cross-sectional areas each substantially greater than the third cross-sectional area.

16. The MRAM cell of claim 15 wherein the first and second portions have first and second thicknesses, respectively, wherein the first thickness is substantially less than the second thickness.

17. The MRAM cell of claim 15 wherein the first and second portions have first and second widths, respectively, wherein the first width is substantially less than the second width.

18. The MRAM cell of claim 15 wherein:
the first and second portions have first and second thicknesses, respectively, wherein the first thickness is substantially less than the second thickness; and
the first and second portions have first and second widths, respectively, wherein the first width is substantially less than the second width.

19. The MRAM cell of claim 15 further comprising:
a first cladding layer at least partially surrounding the first portion, wherein first cladding layer has a profile substantially similar to a profile of the second portions; and
a second cladding layer at least partially surrounding the third portion, wherein the third cladding layer has a profile substantially similar to a profile of the fourth portions.

20. The MRAM cell of claim 15 further comprising a first cladding layer at least partially surrounding the first portion and a second cladding layer at least partially surrounding the third portion.

21. The MRAM cell of claim 15 further comprising a first cladding layer at least partially surrounding each of the first and second portions and a second cladding layer at least partially surrounding each of the third and fourth portions.

22. A method of manufacturing a magnetic random access memory (MRAM) cell, comprising:
forming an MRAM cell stack located over a substrate; and
forming first and second write lines spanning opposing termini of the MRAM cell stack;
wherein at least one of the first and second write lines includes at least one first portion spanning the MRAM cell stack and at least one second portion proximate the MRAM cell stack, the first and second portions having first and second cross-sectional areas, respectively, wherein the first cross-sectional area is substantially less than the second cross-sectional area.

23. The method of claim 22 wherein the at least one of the first and second write lines includes two second portions proximate opposing sides of the MRAM cell stack.

24. The method of claim 22 wherein the first write line includes the first and second portions and the second write line includes at least one third portion spanning the MRAM cell stack and at least one fourth portion proximate the MRAM cell stack, the third and fourth portions having third and fourth cross-sectional areas, respectively, wherein the third cross-sectional area is substantially less than the fourth cross-sectional area.

25. The method of claim 22 wherein the first and second portions have first and second thicknesses, respectively, wherein the first thickness is substantially less than the second thickness.

26. The method of claim 22 wherein the first and second portions have first and second widths, respectively, wherein the first width is substantially less than the second width.

27. The method of claim 22 wherein:
the first and second portions have first and second thicknesses, respectively, wherein the first thickness is substantially less than the second thickness; and
the first and second portions have first and second widths, respectively, wherein the first width is substantially less than the second width.

28. The method of claim 22 further comprising forming a cladding layer at least partially surrounding the first portion.

29. The method of claim 28 wherein at least a portion of a profile of the cladding layer is substantially similar to at least a portion of a profile of the second portion.

30. The method of claim 22 further comprising forming a cladding layer at least partially surrounding each of the first and second portions.

31. An integrated circuit device, comprising:
a magnetic random access memory (MRAM) cell located over a substrate, the MRAM cell including:
an MRAM cell stack located over the substrate; and
first and second write lines spanning opposing termini of the MRAM cell stack;
wherein at least one of the first and second write lines includes at least one first portion spanning the MRAM cell stack and at least one second portion proximate the MRAM cell stack, the first and second portions having first and second cross-sectional areas, respectively, wherein the first cross-sectional area is substantially less than the second cross-sectional area;
a transistor device formed at least partially in the substrate; and
an interconnect coupling one of the first and second write lines and the transistor device.

32. The integrated circuit device of claim 31 wherein the at least one of the first and second write lines includes two second portions proximate opposing sides of the MRAM cell stack.

33. The integrated circuit device of claim 31 wherein the first write line includes the first and second portions and the second write line includes at least one third portion spanning the MRAM cell stack and at least one fourth portion proximate the MRAM cell stack, the third and fourth portions having third and fourth cross-sectional areas, respectively, wherein the third cross-sectional area is substantially less than the fourth cross-sectional area.

34. The integrated circuit device of claim 31 wherein the first and second portions have first and second thicknesses, respectively, wherein the first thickness is substantially less than the second thickness.

35. The integrated circuit device of claim 31 wherein the first and second portions have first and second widths, respectively, wherein the first width is substantially less than the second width.

36. The integrated circuit device of claim 31 wherein:
the first and second portions have first and second thicknesses, respectively, wherein the first thickness is substantially less than the second thickness; and
the first and second portions have first and second widths, respectively, wherein the first width is substantially less than the second width.

37. The integrated circuit device of claim 31 further comprising forming a cladding layer at least partially surrounding the first portion.

38. The integrated circuit device of claim 37 wherein at least a portion of a profile of the cladding layer is substantially similar to at least a portion of a profile of the second portion.

39. The integrated circuit device of claim 31 further comprising forming a cladding layer at least partially surrounding each of the first and second portions.

* * * * *